(12) United States Patent
Fraas

(10) Patent No.: US 6,353,175 B1
(45) Date of Patent: Mar. 5, 2002

(54) TWO-TERMINAL CELL-INTERCONNECTED-CIRCUITS USING MECHANICALLY-STACKED PHOTOVOLTAIC CELLS FOR LINE-FOCUS CONCENTRATOR ARRAYS

(75) Inventor: Lewis M. Fraas, Bellevue, WA (US)

(73) Assignee: JX Crystals Inc., Issaquah, WA (US)

( * ) Notice: Subject to any disclaimer, the term of this patent is extended or adjusted under 35 U.S.C. 154(b) by 0 days.

(21) Appl. No.: 09/662,722

(22) Filed: Sep. 15, 2000

Related U.S. Application Data
(60) Provisional application No. 60/154,334, filed on Sep. 17, 1999.

(51) Int. Cl.[7] .................. H01L 31/05; H01L 31/042
(52) U.S. Cl. .................. 136/255; 136/249; 136/244; 136/256; 136/252; 136/262; 257/431; 257/443; 257/448; 257/459; 257/184
(58) Field of Search ................ 136/249, 244, 136/256, 252, 262, 255; 257/431, 443, 448, 459, 184

(56) References Cited

U.S. PATENT DOCUMENTS

| | | |
|---|---|---|
| 3,433,676 A | 3/1969 | Stein |
| 3,751,303 A | 8/1973 | Kittl |

(List continued on next page.)

OTHER PUBLICATIONS

Piszczor et al, "A high performance photovoltaic concentrator array; the mini–dome fresnel lens concentrators with 30% efficient GaAs/GaSb tandem cells," 22nd IEEE photovoltaic specialists conference, (1991), vol. 11, pp. 1485–1490.*

Höfler et al.; *Selective Emitters for Thermophotovoltaics Solar Energy Conversion*; Solar Cells 1983; 10: pp. 257–271.

Höfler et al.; *Interference Filters for Thermophotovoltaic Solar Energy Conversion*; Solar Cells 1983; 10: pp. 273–286.

Höfler et al.; *Selective Absorbers and Interference Filters for Thermophotovoltaic Energy Conversion*; Proceedings of 5th Photovoltaic Solar Energy Conf., Athens, Greece(Oct. 1983); pp. 225–229.

Morgan et al.; *Radioisotope Themal Photovoltaic Application of the GaSb Solar Cell*; Proceedings of NASA Sprat Conference (1989); pp. 349–358.

Day et al.; *Application of the GaSb Solar Cell in Isotope–heated Power Systems*; Conference Record, 21st IEEE Photovoltaic Specialists Conf. (May 1990); pp. 1320–1325.

Fraas et al.; *Status of TPV Commercial System Development Using GaSb Infrared Sensative Cells*; Presentation at Second World Photovoltaic Specialists Conference, Vienna, Austria; Jul. 6–10, 1998; Pre–print Copy: 5 pages.

*Primary Examiner*—Alan Diamond
(74) *Attorney, Agent, or Firm*—James Creighton Wray; Meera P. Narasimhan

(57) ABSTRACT

Two-terminal circuit has top and bottom cells bonded to an insulating substrate with the top cells bonded on top of the bottom cells. Bottom cells are connected in series through ribbon bonds. Top cells are connected in parallel through ribbon bonds. The ribbon bonds connect to the topsides of the top and bottom cells. The substrate contains metal die bonding pads for the base contacts to the bottom cells. Metal traces are provided for ribbon bond connections to emitter contacts for the bottom cells. A metal trace becomes a positive terminal pad for the bottom cells and a negative terminal for a second pad for the bottom cells. Two cell assemblies may be series connected by connecting positive top cell output connectors with negative pads of top cells in adjacent cell assemblies, and by connecting positive bottom cell output connectors with negative pads of bottom cells in adjacent assemblies.

30 Claims, 4 Drawing Sheets

U.S. PATENT DOCUMENTS

| | | |
|---|---|---|
| 4,234,352 A | 11/1980 | Swanson |
| 4,292,092 A * | 9/1981 | Hanak .................. 438/74 |
| 4,707,560 A | 11/1987 | Hottel et al. |
| 4,746,370 A | 5/1988 | Woolf |
| 4,776,895 A | 10/1988 | Goldstein |
| 5,091,018 A * | 2/1992 | Fraas et al. ............. 136/246 |
| 5,096,505 A | 3/1992 | Fraas et al. |
| 5,118,361 A | 6/1992 | Fraas et al. |
| 5,123,968 A | 6/1992 | Fraas et al. |
| 5,217,539 A | 6/1993 | Fraas et al. |
| 5,248,346 A | 9/1993 | Fraas et al. |
| 5,255,666 A | 10/1993 | Curchod |
| 5,312,521 A | 5/1994 | Fraas et al. |
| 5,356,487 A | 10/1994 | Goldstein et al. |
| 5,383,976 A | 1/1995 | Fraas et al. |
| 5,389,158 A | 2/1995 | Fraas et al. |
| 5,401,329 A | 3/1995 | Fraas et al. |
| 5,403,405 A | 4/1995 | Fraas et al. |
| 5,439,532 A | 8/1995 | Fraas |
| 5,505,789 A | 4/1996 | Fraas et al. |
| 5,512,109 A | 4/1996 | Fraas et al. |
| 5,551,992 A | 9/1996 | Fraas |
| 5,560,783 A | 10/1996 | Hamlen |
| 5,616,186 A | 4/1997 | Fraas et al. |
| 5,651,838 A | 7/1997 | Fraas et al. |
| 5,865,906 A | 2/1999 | Ferguson et al. |

\* cited by examiner

TWO-TERMINAL CELL-INTERCONNECTED-CIRCUITS USING MECHANICALLY-STACKED PHOTOVOLTAIC CELLS FOR LINE-FOCUS CONCENTRATOR ARRAYS

This application claims the benefit of U.S. Provisional Application No. 60/154,334, filed Sep. 17, 1999.

BACKGROUND OF THE INVENTION

In 1989, Fraas and Avery demonstrated a world-record 31% efficient AMO GaAs/GaSb tandem solar cell. This record efficiency still holds today. However, the GaAs/GaSb mechanical-stacked cell was designed to work with concentrated sunlight and at that time, the space community had no experience with concentrated sunlight solar arrays. So the photovoltaic community continued to work on improving flat plate cell efficiencies for satellite power systems. This work led to the adoption of the InGaP/GaAs/Ge monolithic tandem cell with an efficiency of 23%. Meanwhile in 1992, Fraas and Avery fabricated GaAs/GaSb cells and Entech supplied lenses for a concentrator min-module that was flown on the Photovoltaic Advanced Space Power (PASP) satellite. This mini-module performed well with high power density, excellent radiation resistance, and absolutely no problems with sun tracking. The success of the PASP module then led to the successful use of a 2.5 kW line-focus concentrator array as the main power source on Deep Space I. Deep Space I was launched in 1998.

So now, ten years later, concentrating solar photovoltaic arrays are proven. However, Deep Space I used the 23% efficient InGaP/GaAs/Ge monolithic cell in spite of the fact that the mechanically stacked GaAs/GaSb cell had a higher efficiency. This observation leads us to a discussion of the relative trades of monolithic vs. mechanically stacked cells.

Both monolithic and mechanically stacked tandem cells achieve high efficiencies by using multiple materials with multiple junctions sensitive to different portions of the sun's spectrum. In the case of monolithic cells, the different materials are grown as thin single crystal films on a single substrate. This approach is lighter and more elegant. It leads automatically to a two-terminal device that looks just like a simple traditional single-junction cell. Because of its light weight, this approach is preferred for planar space arrays. However, the constraint that the layers are grown as single crystal layers in succession on the same substrate is quite restrictive. All the layers need to have a common crystal structure with a matched atomic spacing. Furthermore, because the multiple junctions are automatically series connected, the junction with the lowest current limits the current of all of the other junctions. It is therefore desirable to match the currents produced in each junction to maximize efficiency. Additionally, manufacturing yields are lower with monolithic cells because of their built in complexity.

Mechanically stacked cells involve separate junctions grown on separate single crystal substrates. This approach does not have the constraints on crystal structure, crystal atomic spacing, or current matching in series connected junctions. To date, the only successful monolithic cell is the InGaP/GaAs/Ge cell, and the only successful mechanically stacked cell is the GaAs/GaSb cell. The atomic spacing for the GaAs and GaSb cells are not matched, but they need not be for a mechanical stack.

The InGaP, GaAs, and Ge crystals, structures and atomic distances are matched. In the dual junction form with junctions in the InGaP and GaAs layers, the currents are matched at 16 mA/cm2 at I sun illumination. However, the dual junction GaAs/GaSb cell outperforms the dual junction InGaP/GaAs cell because the GaSb cell captures solar energy not available to the InGaP/GaAs cell. In other words, the GaAs/GaSb pair responds to the sun's spectrum over the range between 0.4 and 1.8 microns, whereas the InGaP/GaAs cell only responds to the spectral range between 0.4 and 0.9 microns. This larger response range explains why the GaAs/GaSb cell outperforms the InGaP/GaAs dual junction cell.

In recent times, the manufacturers of the monolithic cells have made some improvements by placing a third junction in the Ge substrate. This approach has led to an efficiency of 27%. However, this approach has still not closed the gap with the GaAs/GaSb mechanically stacked cell. There are two reasons for this. While the Ge cell can receive energy in the spectral range between 0.9 and 1.8 microns, the Ge cell is not current matched with the InGaP/GaAs pair. Its excess current cannot be used. The current from the GaSb cell an the other hand is not limited. Furthermore, the Gasb cell generates 20% more voltage. Additionally, the Ge cell performance degrades rapidly with high-energy particle irradiation.

So, there are good reasons to work with mechanically stacked cells. However, there has been a barrier. Referring to FIG. 1, the traditional mechanically stacked cell is a four terminal device with + and − connections on both the top and bottom cells. However, the user community wants two terminal devices. While we have previously described two terminal voltage matched circuits as a solution to this problem, in practice, circuit assembly to date has been very complex. A principal reason for this complexity has been the contact to the bottom of the top cell. This backside contact pad is not readily accessible.

There is a need for a two terminal circuit using mechanically stacked cells where the circuit assembly can be accomplished inexpensively using conventional automated circuit assembly equipment. There is also a need to increase the efficiency for these circuits to still higher values.

SUMMARY OF THE INVENTION

The object of the present invention is a two-terminal cell-interconnected circuit consisting of a substrate with bonding pads for bonding a first set of infrared sensitive cells with a second set of visible light sensitive cells mechanically stacked and adhesive bonded on top of the first set of cells. The substrate contains metal traces for wiring the bottom cells in series. It also contains metal traces for wiring the top cells in parallel. The number of series connected bottom cells and the number of parallel connected top cells are chosen such that the voltages produced by the top and bottom cell circuits at maximum power are nearly equal. A unique feature of these circuits that makes them easy to manufacture is that the + and − contacts for the top cells are both on the topside of the top cells. Herein, we refer to these circuits as mechanically stacked cell-interconnected-circuits (MS-CiCs).

In these circuits, the top cells are either single-junction AlGaAs/GaAs cells or dual junction InGaP/GaAs cells (grown on IR transparent GaAs substrates). In either case, these cells respond to sunlight in the spectral range between 0.4 and 0.9 microns. The bottom cells can either be GaSb cells or InGaAs/InP cells. Again, in either case, these bottom cells respond to the sun's spectrum between 0.9 and 1.8 microns. The top cells are fabricated with a grid on their backsides so that they allow the spectral power between 0.9 and 1.8 microns to pass through to the bottom cells.

Several companies have reported on InGaP/GaAs cells with the highest reported efficiency being 26.9%. Given InGaP/GaAs top cells, JX Crystals has recently fabricated four terminal stacks using GaSb bottom cells where the GaSb cell boosted the efficiency of the top cell by 6.5 percentage points. This implies that an efficiency of 26.9%+6.5%=33.4% is achievable.

These and further and other objects and features of the invention are apparent in the disclosure, which includes the above and ongoing written specification, with the claims and the drawings.

DETAILED DESCRIPTION OF THE PREFERRED EMBODIMENTS

Figure 1:
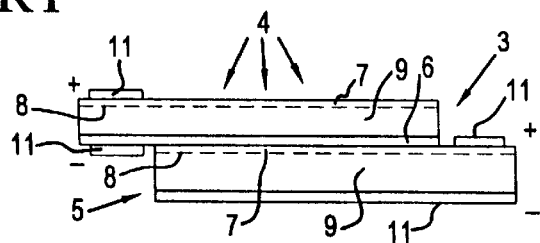
FIG. 1 is a schematic of a prior art four-terminal mechanically stacked photovoltaic device.

FIG. 1 shows a simple mechanically stacked tandem cell. It consists of a top cell 3 closest to an illumination source 4 stacked on top of a bottom cell 5. The two cells are bonded together with a thin layer of a transparent adhesive 6. Each cell contains an emitter region 7 closest to the illumination source and a base region 9 separated by one or more junctions 8. Each cell has contact pads 11 to the emitter and base regions.

Several MS-CIC designs are possible depending on the particular top and bottom cell materials chosen. In the following, we list the four sets of material choices that are immediately available:

|    | Top Cell   | Bottom Cell |
|----|------------|-------------|
| 1. | InGaP/GaAs | GaSb        |
| 2. | GaAs       | GaSb        |
| 3. | InGaP/GaAs | InGaAs/InP  |
| 4. | GaAs       | InGaAs/InP  |

The specific differences between the various MS-CICs will result from the different number of bottom cells required for voltage matching with the top cell. For example, the voltage-matching ratio for the GaAs/GaSb case is 1 to 3, whereas the voltage-matching ratio for the InGaP/GaAs/GaSb case is 1 to 7.

Herein, we describe a MS-CIC design that is appropriate for the InGaP/GaAs/GaSb cell set. In this case, seven GaSb cells wired in series will yield a maximum power voltage which is 7×0.34 V=2.38 V. This value is nearly equal to the maximum power voltage of 1 InGaP/GaAs cell, i.e. 2.27 V.

We note in passing that this 1 to 7 ratio is the appropriate value for room temperature operation. If the design operating temperature of the MS-CIC is appreciable higher, this ratio could change to 1:8. However, the design principles are the same.

One preferred embodiment of the invention is shown in FIGS. 2 through 7.

Figure 2:
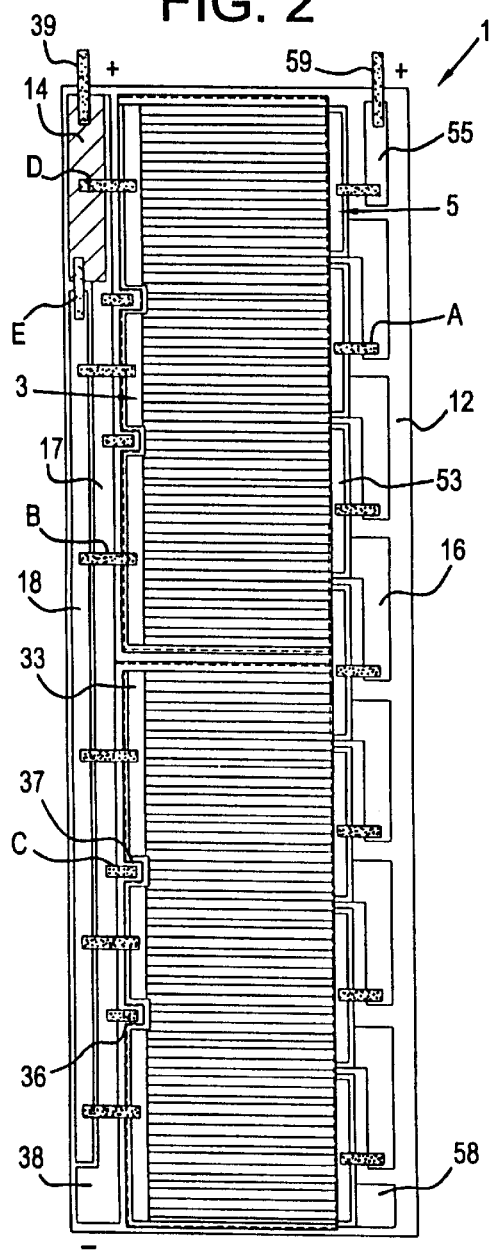
FIG. 2 is a top view of a complete two-terminal cell-interconnected-circuit using mechanically stacked photovoltaic cells, i.e. a MS-CIC.

FIG. 2 shows a top view of the MS-CIC 1 of the present invention. It contains seven bottom cells 5 die bonded to an insulating substrate 12, with two top cells 3 adhesive bonded on top of the bottom cells. The seven bottom cells are wired together in series through the ribbon bonds A. The two top cells are in parallel with each other and therefore generate a voltage that is equivalent to one larger top cell. The top cells are connected to the circuit through ribbon bonds at B, C, and D. A special feature of this circuit is that all ribbon bonds (A, B, C, and D) connect to the topsides (accessible) of both top and bottom cells. This feature facilitates the automated assembly of these circuits. This circuit also contains an optional bypass diode 14 to protect the InGaP/GaAs top cells against reverse bias breakdown. Ribbon bond E connects outer trace 18 to diode 14.

Figure 3:
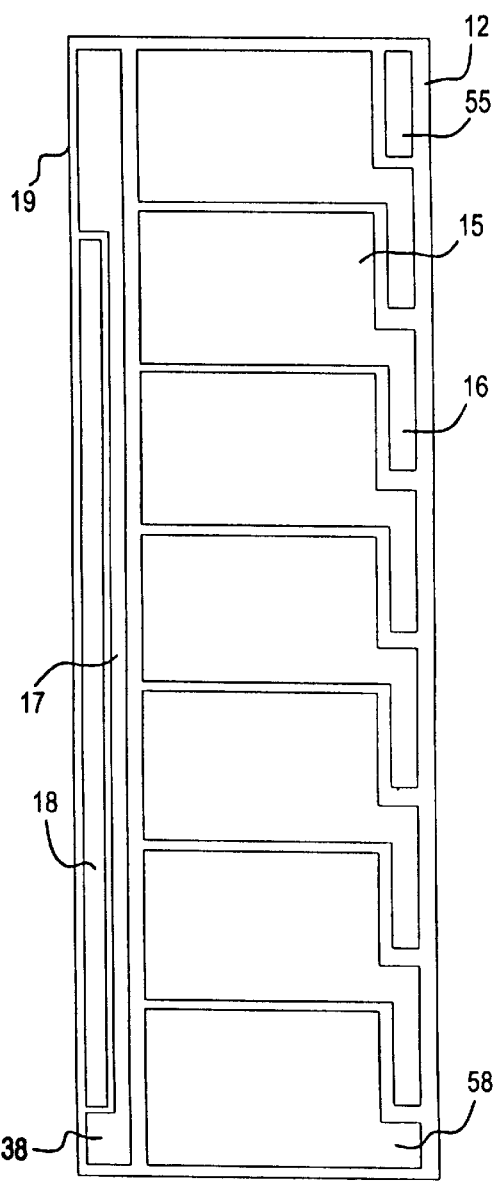
FIG. 3 is a top view of the substrate for the MS-CIC of FIG. 2 showing the metal bonding pads and circuit traces.

FIG. 3 shows a top view of the substrate 12. It is fabricated from an insulating material such as alumina. It contains metal die bonding pads 15 for the base contacts to the bottom cells. At the right of these pads, there are metal traces 16 for ribbon bond connections A to the emitter contacts for the bottom cells. Bases are connected to emitters of adjacent bottom cells in series connections. At the top of FIG. 2, a metal trace 55 is shown, which becomes the positive terminal pad 55 for the bottom cells.

In the lower part of FIG. 2 a metal trace is shown, which becomes the negative terminal pad 58 for the bottom cells.

Two cell assemblies, such as shown in FIG. 2, may be series connected by connecting the positive top cell output connectors 39 with negative pads 38 of top cells in the next adjacent cell assemblies, and by connecting the positive output connectors 59 with the negative pads 58 of the bottom cells in the adjacent assemblies.

On the left of this substrate, there are two metal traces for the ribbon bond connections to the top cells. The inner trace 17 is for connections to the base regions of the top cells while the outer trace 18 is for connections to the emitter regions. At the bottom of FIG. 2, an enlarged end of inner trace 17 becomes the negative terminal pad 38 for the top cells. In a typical design for a MS-CIC compatible with the Deep Space I lens and module designs, the substrate 12 would be 1.8 cm wide by 6.1 cm long. The line-focus lens used on Deep Space I is 8 cm wide.

Figure 4A:
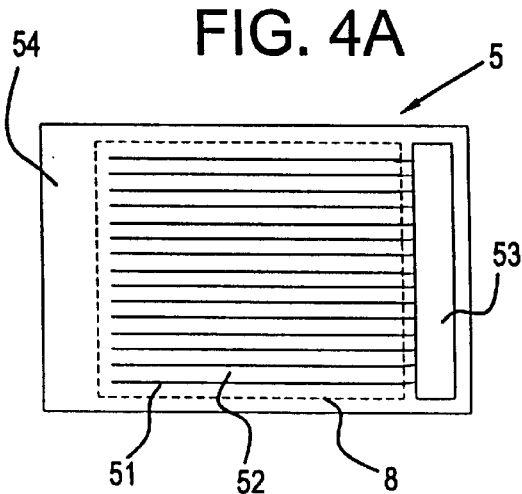
FIGS. 4A and 4B show the top and side views of the bottom cells used in the MS-CIC in FIG. 2.
Figure 4B:
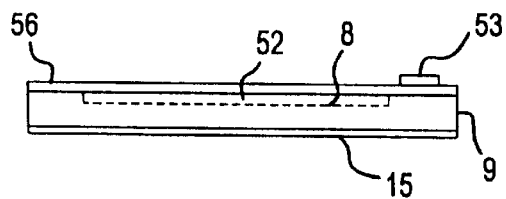
Figure 5:
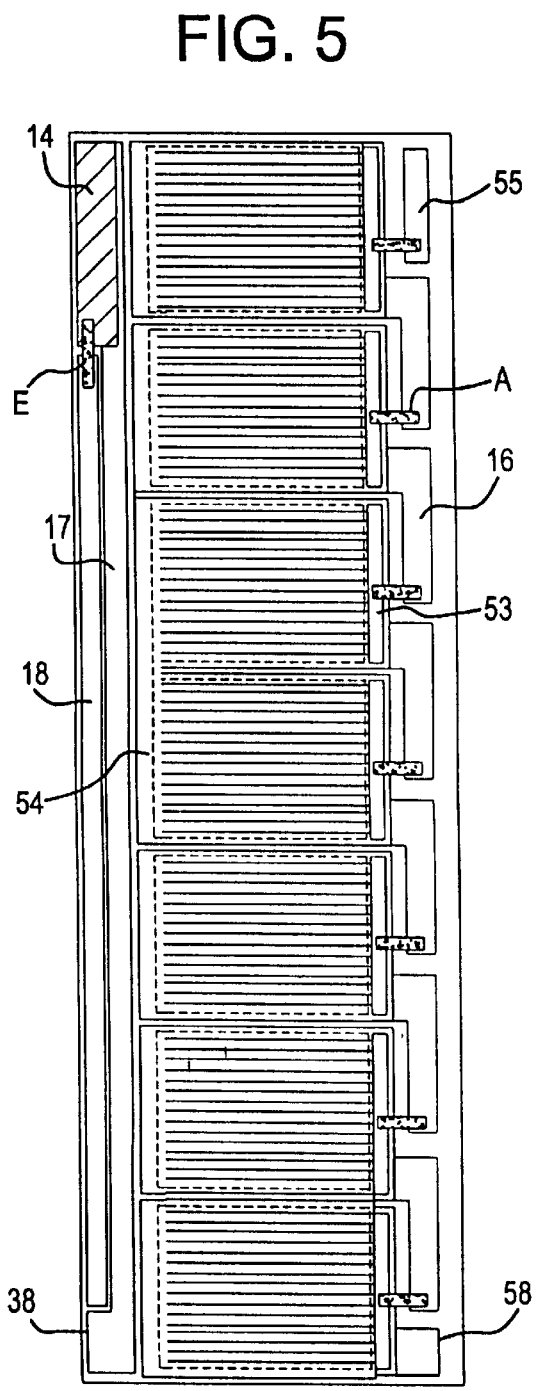
FIG. 5 shows the bottom cells bonded in place on the substrate of FIG. 3.

FIGS. 4A and 4B show the top and side views of the bottom cell 5. This cell contains grid lines 51 in contact with the illuminated emitter region 52. The grid lines 51 carry current to the metal bus 53. The cell is larger than at first it appears that it needs to be, because it contains the inactive region 54. However as can be seen in FIG. 5, the region 54 serves as a support underneath the top cell ribbon-bonding region in the complete MS-CIC. This mechanical support prevents top cell breakage during top cell ribbon bonding. The DSI compatible cell dimensions are 1.2 cm×0.85 cm. The illuminated emitter dimensions are 1 cm×0.84 cm. An insulator 56 covers the bottom cell 5.

Figure 6A:
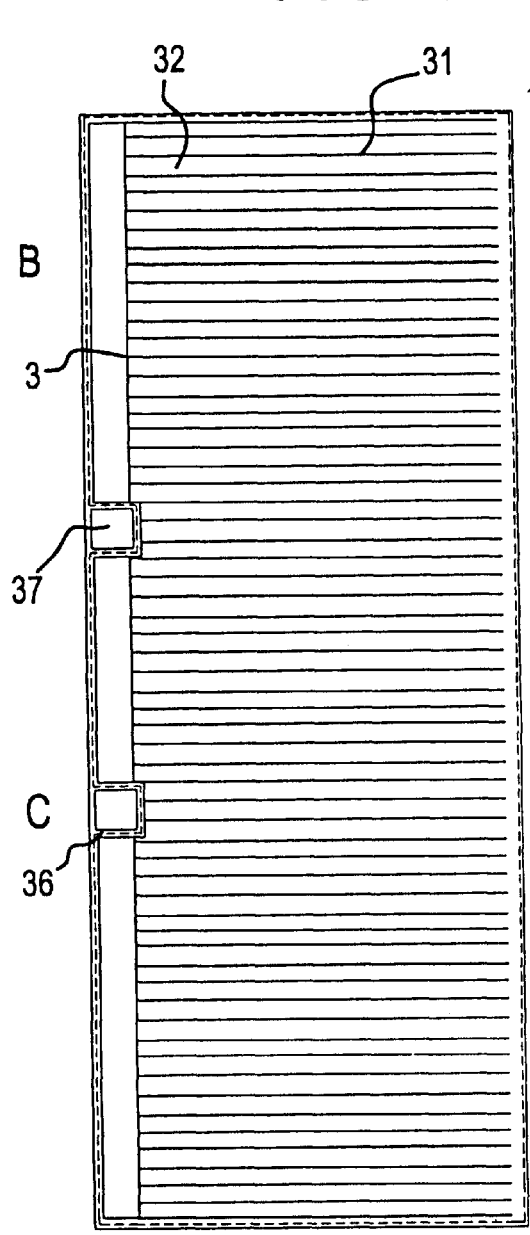
FIGS. 6A, 6B and 6C show top and cross-sectional side views for the top cell used in the MS-CIC in FIG. 2.
Figure 6B:
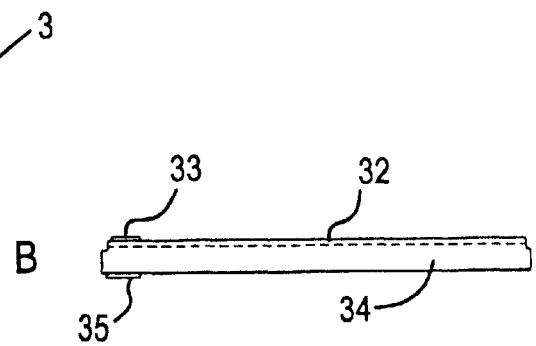
Figure 6C:
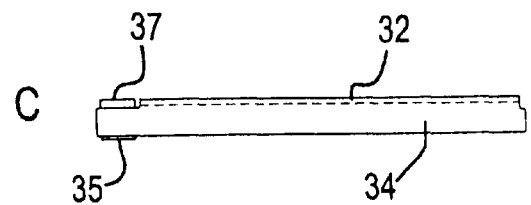
Figure 7A:
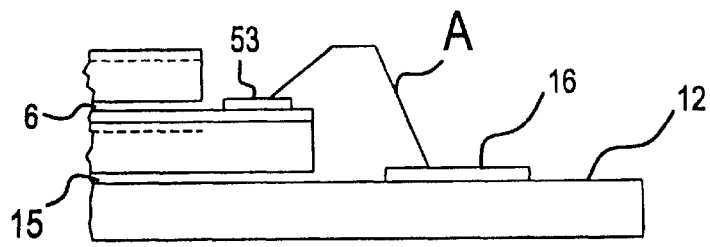
FIGS. 7A, 7B, 7C and 7D show detailed side views for the different ribbon bond configurations used in the MS-CIC of FIG. 2.
Figure 7B:
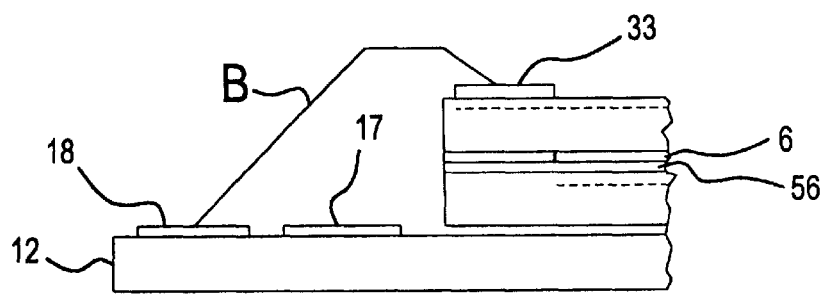
Figure 7C:
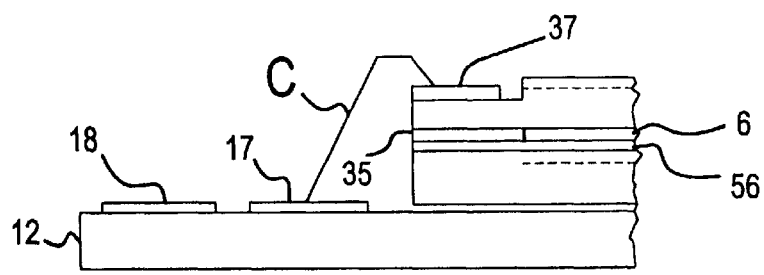
Figure 7D:
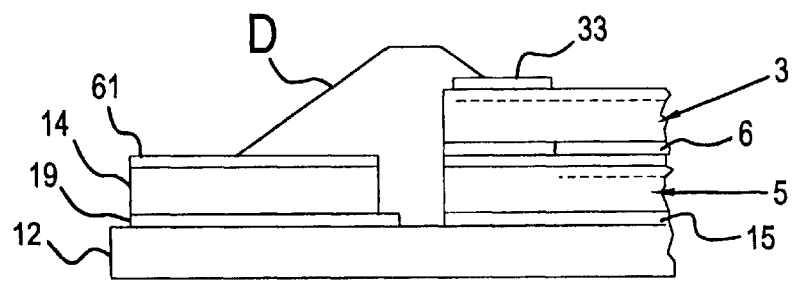

FIG. 6 shows the top view and side views for the top cell 3. This cell contains grid lines 31 on its front side in contact with the emitter 32. The grid lines 31 are connected to an emitter metal bus 33. There are also grid lines (not shown) on the back of this cell in contact with the cell base region 34. The backside grid lines carry current to a backside bus 35. On the front left side, there are regions 36 where the emitter and junction have been etched away exposing the base. Topside base region contact pads 37 are deposited in these regions. The resistance associated with current transfer from the backside bus through the thin base region to these pads is negligible for the low solar concentration ratios associated with line-focus lenses. The DSI compatible cell dimensions are 1.1 cm×3 cm.

FIG. 7 shows the ribbon bonding configurations for the MS-CIC at points A, B, C, and D. Note that all bonds are located on the top accessible side of the MS-CIC. MS-CIC assembly is then quite straight forward. Given the patterned substrate and top and bottom cells. The assembly proceeds as follows.

First, bottom cell base contact die bonding pads 15, metal traces 16, 17 and 18 and contact pads 19, 38, 55 and 58 are deposited on substrate 12. Using an automated pick and place machine, the bottom cells are die bonded to the substrate pads. The bypass diode 14 is also die bonded to pad 19 on inner trace 17.

Second, using an automated ribbon bonder, the emitter buses 53 of the bottom cells 5 are wired A to the substrate traces 16 and pad 8 and 55 in series.

Third, using transparent adhesive and the automated pick and place machine, the top cells 3 are bonded in place.

Fourth, using the automated ribbon bonder, the top cells 3 are wired B, C to the traces 17 and 18 on the substrate in parallel. The upper top cell is wired D to the positive connector pad 61 on diode 14, and the outer trace 18 is wired E to the diode connector pad 61. The wiring A of the bottom cell may be done concurrently.

Fifth, using an automated pick and place machine, glass cover slides are adhesive bonded to the top cells for radiation protection.

While the invention has been described with reference to specific embodiments, modifications and variations of the invention may be constructed without departing from the scope of the invention.

I claim:

1. Two terminal circuit apparatus comprising a substrate, bottom cells on the substrate, top cells stacked on the bottom cells, two terminals on top sides of the top cells, and bonds for bonding the top and the bottom cells, the bonds forming electrical connections to top sides of the top cells and to top sides of the bottom cells.

2. The apparatus of claim 1, wherein the bottom cells are infrared sensitive cells.

3. The apparatus of claim 2, wherein the top cells are visible light sensitive cells.

4. The apparatus of claim 3, wherein the substrate is an insulating substrate comprising metal traces.

5. The apparatus of clain 4, wherein the metal traces are adapted for wiring the bottom cells in series.

6. The apparatus of claim 5, wherein the metal traces are adapted for wiring the top cells in parallel.

7. The apparatus of claim 5, wherein a ratio of a number of the bottom cells to a number of the top cells is variable and wherein the ratio is a voltage-matching ratio such that voltages produced by the top cells and by the bottom cells are equal.

8. The apparatus of claim 1, wherein the terminals comprise positive and negative terminals of the top cells provided on topsides of the top cells forming mechanically stacked cell-interconnected-circuits.

9. The apparatus of claim 1, wherein the top cells are single-junction AlGaAs/GaAs cells.

10. The apparatus of claim 1, wherein the top cells are dual junction InGaP/GaAs cells.

11. The apparatus of claim 10, wherein the cells are grown on infrared transparent GaAs substrates.

12. The apparatus of claim 1, wherein the top cells respond to sunlight in a spectral range between about 0.4 and 0.9 microns.

13. The apparatus of claim 1, further comprising a grid on a backside of the top cells for allowing spectral power between 0.9 and 1.8 microns to pass through to the bottom cells.

14. The apparatus of claim 1, wherein the bottom cells are GaSb cells.

15. The apparatus of claim 1, wherein the bottom cells are InGaAs/InP cells.

16. The apparatus of claim 1, wherein the bottom cells respond to sunlight in a spectral range between about 0.9 and 1.8 microns.

17. The apparatus of claim 1, further comprising plural terminal stacks of cells.

18. The apparatus of claim 17, wherein the stacks of cells comprise top and bottom cells, and wherein the bottom cells are GaSb cells.

19. The apparatus of claim 1, wherein the top and the bottom cells are selected from the group consisting of sets of InGaP/GaAs-GaSb, GaAs-GaSb, InGaP/GaAs-InGaAs/InP, and GaAs-InGaAs/InP cells and combinations thereof, respectively.

20. The apparatus of claim 1, wherein the bonds are ribbon bonds for bonding the bottom cells together in series.

21. The apparatus of claim 20, wherein the ribbon bonds bond the top cells to the circuit, and wherein the top cells are in parallel.

22. The apparatus of claim 21, wherein the ribbon bonds are on top sides of the top and the bottom cells facilitating automated assembly of circuits.

23. The apparatus of claim 1, further comprising a reverse bias diode connected to the circuit for avoiding reverse bias breakdown.

24. The apparatus of claim 1, wherein the substrate comprises alumina.

25. The apparatus of claim 22, further comprising a bonding of metal die bonding pads forming base contacts with the bottom cells.

26. The apparatus of claim 25, further comprising metal traces in the substrate for connecting the ribbon bonds.

27. The apparatus of claim 26, further comprising emitter contacts for the bottom cells, wherein the ribbon bonds connect the substrate and the emitter contacts.

28. The apparatus of claim 27, further comprising bases connected to emitters in adjacent bottom cells in series connections.

29. The apparatus of claim 28, further comprising metal traces in the substrate for forming positive and negative terminals for the top and the bottom cells.

30. The apparatus of claim 1, further comprising at least one pair of cell assemblies, and connectors for connecting a positive top cell output with negative pads of top cells of adjacent cell assemblies, and for connecting positive bottom cell output with negative pads of bottom cells of adjacent cell assemblies.

* * * * *